United States Patent
Keller

(10) Patent No.: US 7,277,136 B2
(45) Date of Patent: Oct. 2, 2007

(54) ADAPTIVE BANDWIDTH CONTROL IN A KINESCOPE AMPLIFIER

(75) Inventor: Anton Werner Keller, Arni (CH)

(73) Assignee: Thomson Licensing, Boulogne, Billancourt (FR)

( * ) Notice: Subject to any disclaimer, the term of this patent is extended or adjusted under 35 U.S.C. 154(b) by 454 days.

(21) Appl. No.: 10/486,489

(22) PCT Filed: Aug. 20, 2002

(86) PCT No.: PCT/EP02/09292

§ 371 (c)(1),
(2), (4) Date: Feb. 10, 2004

(87) PCT Pub. No.: WO03/019934

PCT Pub. Date: Mar. 6, 2003

(65) Prior Publication Data

US 2004/0212740 A1    Oct. 28, 2004

Related U.S. Application Data

(60) Provisional application No. 60/314,376, filed on Aug. 23, 2001.

(51) Int. Cl.
H04N 5/68    (2006.01)

(52) U.S. Cl. .......... 348/707; 348/379; 348/711

(58) Field of Classification Search ........ 348/707–713, 348/377–380; 330/44, 45
See application file for complete search history.

(56) References Cited

U.S. PATENT DOCUMENTS

| | | | | |
|---|---|---|---|---|
| 3,969,762 A * | 7/1976 | Favreau | | 348/711 |
| 4,745,477 A * | 5/1988 | Bell et al. | | 348/532 |
| 5,495,214 A | 2/1996 | Malota | | 330/265 |
| 5,543,974 A * | 8/1996 | Sugita | | 386/113 |
| 5,933,197 A * | 8/1999 | Kudo | | 348/555 |
| 6,329,770 B1 | 12/2001 | Allender et al. | | 315/383 |

FOREIGN PATENT DOCUMENTS

| GB | 2 127 638 | 4/1984 |
|---|---|---|
| JP | 08340221 | 12/1996 |

* cited by examiner

*Primary Examiner*—Michael H. Lee
(74) *Attorney, Agent, or Firm*—Joseph J. Laks; Robert D. Shedd; William A. Lagoni

(57) ABSTRACT

A method for controlling dissipation in a video amplifier for a display signal. The method comprises the steps of setting a first current for establishing a first gain bandwidth product in the video amplifier. Generating a control signal in accordance with a slew rate of the display signal. Modifying the first current responsive to the control signal such that the video amplifier gain bandwidth product is controlled in accordance with the slew rate of said display signal.

18 Claims, 3 Drawing Sheets

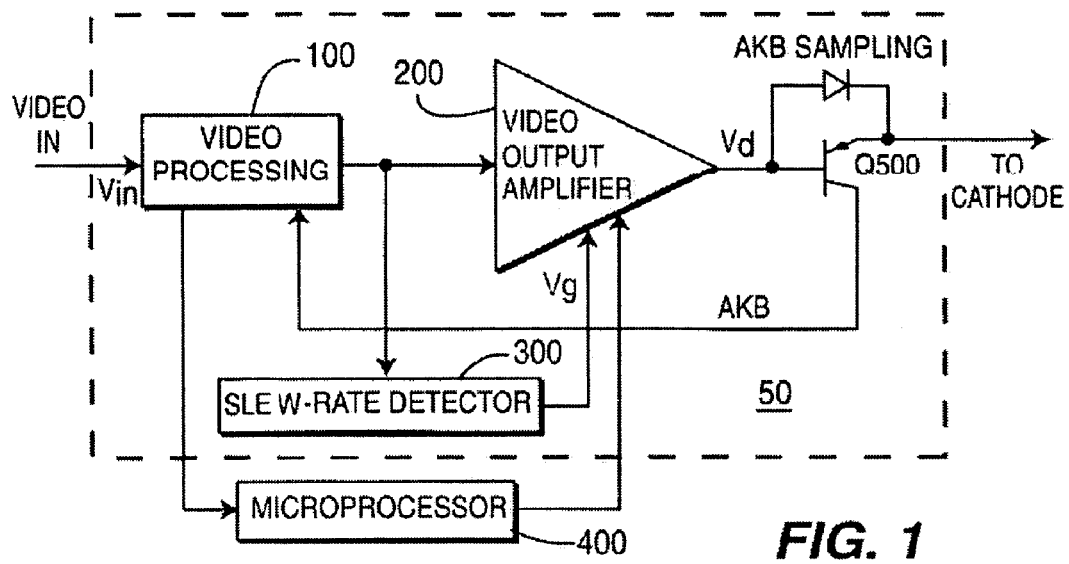
FIG. 1
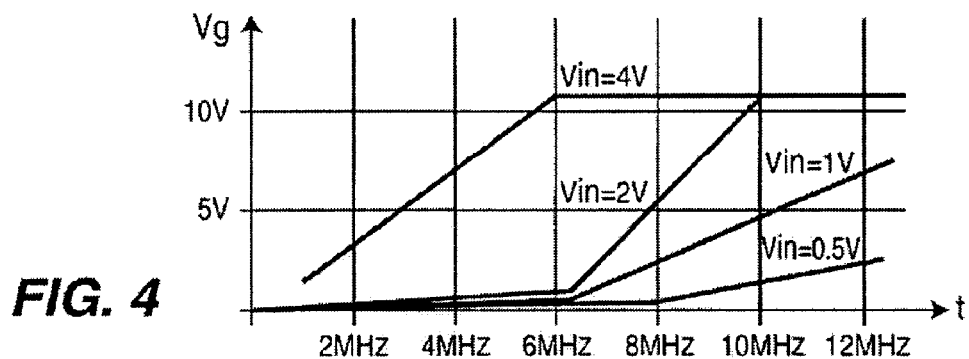
FIG. 4
|  |  | Ic(Q2): | TEMPERATURE (Q2): |
|---|---|---|---|
| LIVE TV | SMALL BW | 6mA | 53° |
|  | LARGE BW | 15mA | 82° |
| MULTIBURST 1-10MHZ | SMALL BW | 6mA | 56° |
|  | LARGE BW | 15mA | 87° |
FIG. 5

ADAPTIVE BANDWIDTH CONTROL IN A KINESCOPE AMPLIFIER

This application claims the benefit under 35 U.S.C. § 365 of International Application PCT/EP02/09292 filed Aug. 20, 2002, which claims the benefit of U.S. Provisional Application No. 60/314,376 filed Aug. 23, 2001.

This invention relates to the field of video display technology and in particular to the dynamic control of power dissipation in accordance with the spectral content of the display signal.

BACKGROUND OF THE INVENTION

In addition to the display of broadcast television programming, television receivers often provide a monitor capability for the display video or graphical material from other signal sources such as DVD players, computers and computer games. The bandwidth of these non-broadcast signals may vary from 3.5 MHz for a VCR derived video signal, to the region of 25 MHz for computer generated images. The power consumption of a video output amplifier in the TV monitor display increases with the bandwidth required to faithfully display the non-broadcast signal bandwidth and amplitude. Modern TV displays frequently display signals from different sources often with different content bandwidths. Typically an average power dissipation in a simple class-A video amplifier with a bandwidth in a range from 5 MHz to 20 MHz will correspondingly dissipate between 2W to 5W. However, in a high bandwidth active load amplifier this can easily exceed 5 Watts. Because a cathode ray tube receiver monitor contains three video output amplifiers these can represent a significant contribution to the total power consumption of the display.

It is known to control an operating point of a video amplifier by means of feedback from a current path which undergoes a parameter change as a consequence of operation at increasing frequencies. The feedback signal can be developed across an emitter resistor in proportion to the current which increases at higher frequencies. The feedback signal is filtered and applied to the amplifier input to influence the operating point.

To reduce levels of unintentional emissions it is known to analyze the spectral content of a display signal and generate an emission control signal in accordance with input signals likely to cause emissions. Such a control signal can be applied to reduce subjective video peaking effects produced by scanning velocity modulation (SVM), or to dynamically modulate video peaking circuitry to diminish emissions. It can be appreciated that analysis of the spectral content of the display signal can provide an accurate indication of likely emission candidates, with the remedy being the dynamic reduction of image enhancement. However such dynamic enhancement control is unlike the objectives herein which adaptively control amplifier bandwidth to be sufficient for the actual display signal present at the amplifier input.

With increasing computer and video game usage plus 24 hour broadcast or cable programming availability, television receiver monitors can be operational for extended periods of time, hence it would be beneficial in terms of device reliability and energy consumption to reduce the power dissipated by the display.

SUMMARY OF THE INVENTION

In an advantageous circuit arrangement the bandwidth of the video output stage is continuously adjusted in accordance with to the bandwidth requirement or spectral components present or expected in the input signal. As a result, power consumption is reduced when displaying video signals of lower resolution. In a further arrangement, the bandwidth can be adaptively switched between two bandwidth values, normal and wide, by a control signal. This adaptive bandwidth control can be generated by a microcontroller by extracting bandwidth-related data from the video signal or input signal selection.

In an inventive method dissipation is controlled in a video amplifier for a display signal. The method comprises the steps of setting a first current for establishing a first gain bandwidth product in the video amplifier. Generating a control signal in accordance with a slew rate of the display signal. Modifying the first current responsive to the control signal such that the video amplifier gain bandwidth product is controlled in accordance with the slew rate of the display signal.

In a further inventive arrangement a video amplifier for a cathode ray tube display comprises a video processing amplifier with an output drive amplifier coupled to video processing amplifier and supplying an amplified video signal from the video processing amplifier for display by the cathode ray tube. The output drive amplifier is coupled the video processing amplifier to form a negative feed back loop, and a feed forward open loop control signal generated by the video processing amplifier is applied to control a bandwidth of the output drive amplifier.

In yet a further inventive arrangement the feed forward open loop control signal is generated in accordance with a slew rate of the video display signal.

BRIEF DESCRIPTION OF THE DRAWINGS

FIG. 1 is a block diagram of a video amplifier including inventive arrangements.

FIG. 4 depicts the frequency response of the inventive slew rate detector of FIG. 3.

FIG. 5 shows current requirements and temperature variation of an a video amplifier controlled in accordance with the inventive arrangements of FIGS. 1, 2, 3 and 4.

DETAILED DESCRIPTION

Figure 2:
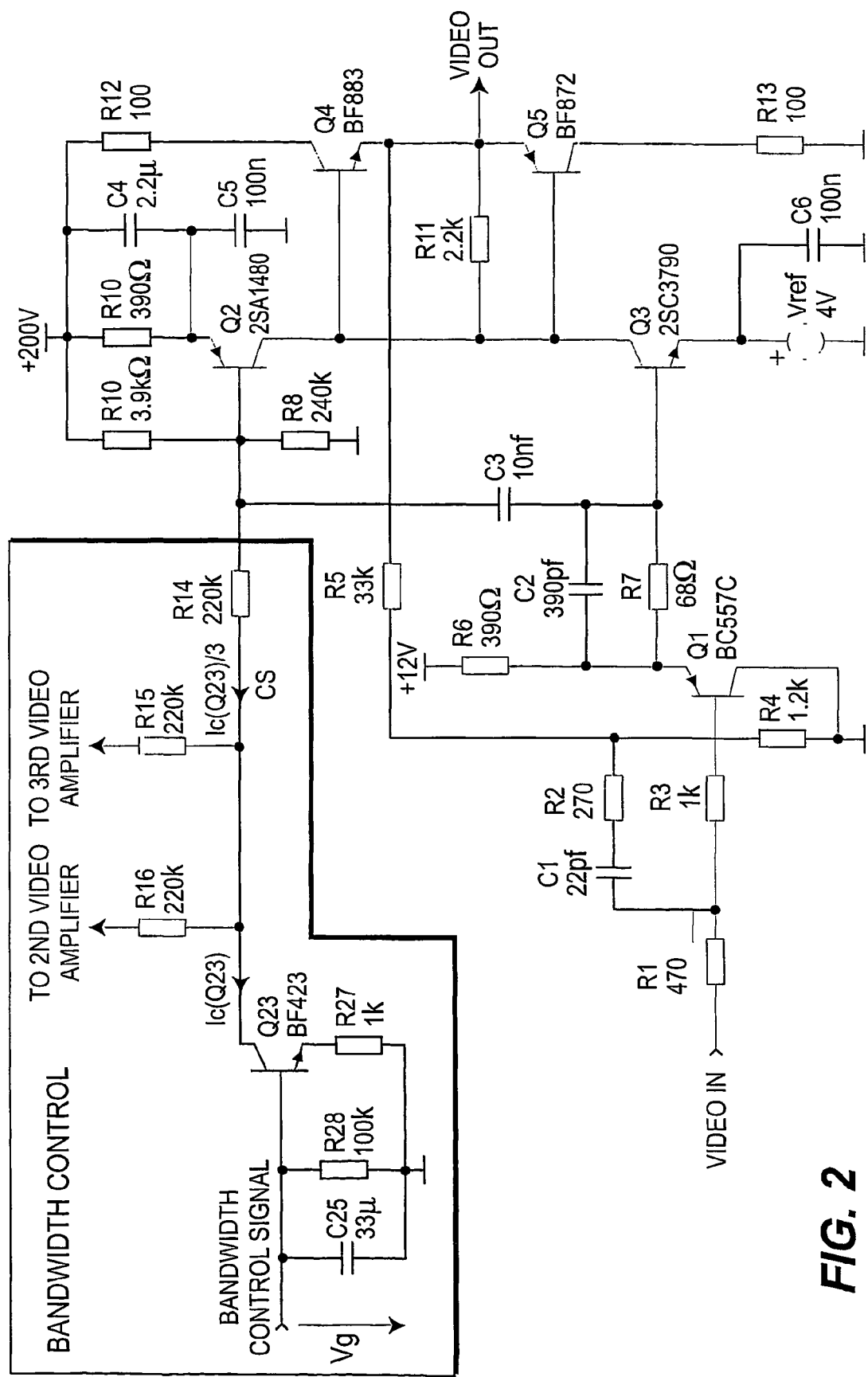
FIG. 2 is a schematic circuit including the inventive arrangements of FIG. 1.

The block diagram shown in FIG. 1 depicts a cathode ray tube drive amplifier including various inventive arrangements wherein the amplifier bandwidth is adaptively controlled in accordance with the spectral content of the signal to be displayed. In a color cathode ray tube display blocks 100, 200, 250, 400 and 500 are present for each display color, however, microprocessor controller 400 can provide color specific control signals for each color channel. A color display signal, for example red green or blue from, from an exemplary color demodulator or external base band source is input to video processing block 100 for amplification and, for example, DC bias control. Control of the DC content or component of a display signal by means of an automatic kinescope bias or (AKB) feed back control loop is well known and serves to maintain a predetermined current at each cathode of a cathode ray tube display.

Processing block 100 supplies a color display signal, for example red green or blue, to video output amplifier 200 and also supplies the amplified and DC controlled video signal to block 300 which generates a control signal Vg in accordance with the detected frequency content or slew-rate occurring within the video signal. The derivation of adaptive dynamic bandwidth control signal Vg will be described with reference to FIG. 3. The slew-rate related, adaptive bandwidth control signal Vg from block 300 is coupled to a video output block 200 which will be described with reference to FIG. 2.

A further adaptive bandwidth control signal is developed within microcontroller block 400 which employs a microprocessor to deduce or infer information about the likely signal content from indicators such as the signal standard or type of input connector selected as an input source. In this way microcontroller 400 can provide a fixed or preset bandwidth control for video output amplifier 200. In yet a further arrangement the temperature of the output transistors forming amplifier 200 can be used as a bandwidth control arbiter where a temperature excess causes a predetermined amplifier bandwidth reduction.

The adaptive bandwidth controlled video signal from video output block 200 is coupled to an automatic kinescope bias or (AKB) sampling transistor Q 500 connected as an emitter follower. As is known, CRT cathode current from the collector of transistor Q 500 is sourced from video processor 100 and can be considered to form a negative back control loop for stabilizing the DC component of the display video and hence the brightness of the display image. An exemplary automatic kinescope bias control loop employs test or calibration lines, representing a dark gray or low level signal which are inserted into the vertical blanking interval of the display video signal. The CRT cathode current resulting from these calibration lines is compared with a desired current value and corrective adjustments applied to a DC component of the display video signal. In this way all three cathode currents are matched to a common value.

The various adaptive control arrangements shown in FIG. 1 can be considered to represent not only a closed, negative feedback control loop for DC stability and automatic kinescope bias (AKB), but in addition open loop, feed forward controls for the dynamic control of output amplifier bandwidth. In this way the provision of unnecessary drive amplifier bandwidth is avoided and consequently power dissipation is significantly reduced.

Video output amplifier 200 with adaptive bandwidth control is depicted in schematic form by FIG. 2. In the absence of dynamic bandwidth control the amplifier can be considered a common wide bandwidth, active load video output amplifier. An input signal from video processor 100 is coupled to the base of emitter follower transistor Q1 via a gain trimming and feedback network formed by resistors R1, R2, R3, R4 and R5 and capacitor C1. The emitter of PNP transistor Q1 is coupled to a +12 volt supply via resistor R6 and drives the base of NPN amplifier transistor Q3 via a parallel connected resistor R7 and capacitor C2 combination which provides frequency shaping. The base of transistor Q3 is also connected to the base of PNP amplifier transistor Q2 via a coupling capacitor C3.

The signal at the base of transistor Q3 generates a collector current Ic and the open loop gain of the amplifier is determined as shown below by current Ic, Gain open loop=$-g_m R_c$, where $R_c$=transistor Q3 load impedance, and substituting for $g_m$, where $g_m=1/r_e$, and $r_e=25/I_c$ (mA), Gain open loop=$-R_c \cdot I_c/25$, It is known that the gain bandwidth product or fT of a common emitter amplifier, for example transistor Q3, varies with collector current and follows a somewhat convex curve. For example, at a low collector current a lower fT results than can be obtained with a higher current. However, the provision of a transistor working point with a higher collector current thereby yielding a higher gain bandwidth product in expectation of wide bandwidth signal handling capability results in unnecessary transistor power dissipation. Thus the advantageous variation of collector current Ic in accordance with input signal slew rate permits the dynamic input signal regulation of open loop gain, gain bandwidth product and consequently amplifier bandwidth.

The upper transistor Q2 is configured in a common emitter mode that is driven with the high frequency content of the video signal from emitter follower Q1 via capacitor C3. The maximum output signal amplitude at the emitters of driver transistors Q4 and Q5 is proportional to the quiescent current of transistor Q2, which is set by biasing resistors R9 and R10. The lower current limit is defined by the DC feedback current provided by resistor R5, the maximum current is set by the transistor parameters which specify the maximum permitted collector current or power dissipation. Advantageously, by changing the current in transistors Q2 and Q3 the overall bandwidth of the amplifier can be controlled. An inventive bandwidth control circuit, to be described with reference to FIG. 3, can change the quiescent current in transistor Q2 and thus change the bandwidth of amplifier 200

A control current for example Ic(Q23)/3 from the collector of transistor Q23 is coupled to the base of transistor Q2 via resistor R14 and provides transistor Q2 collector current with a control range of 6 mille Amperes (mA) to 15 mille Amperes (mA). As a consequence of dynamic current control and the DC loop gain of the video amplifier, the DC component present in the output CRT drive signal can vary. However, as mentioned previously, the negative feedback control provided by the automatic kinescope bias (AKB) control loop can adequately compensate for this source of display signal DC variation.

Figure 3:
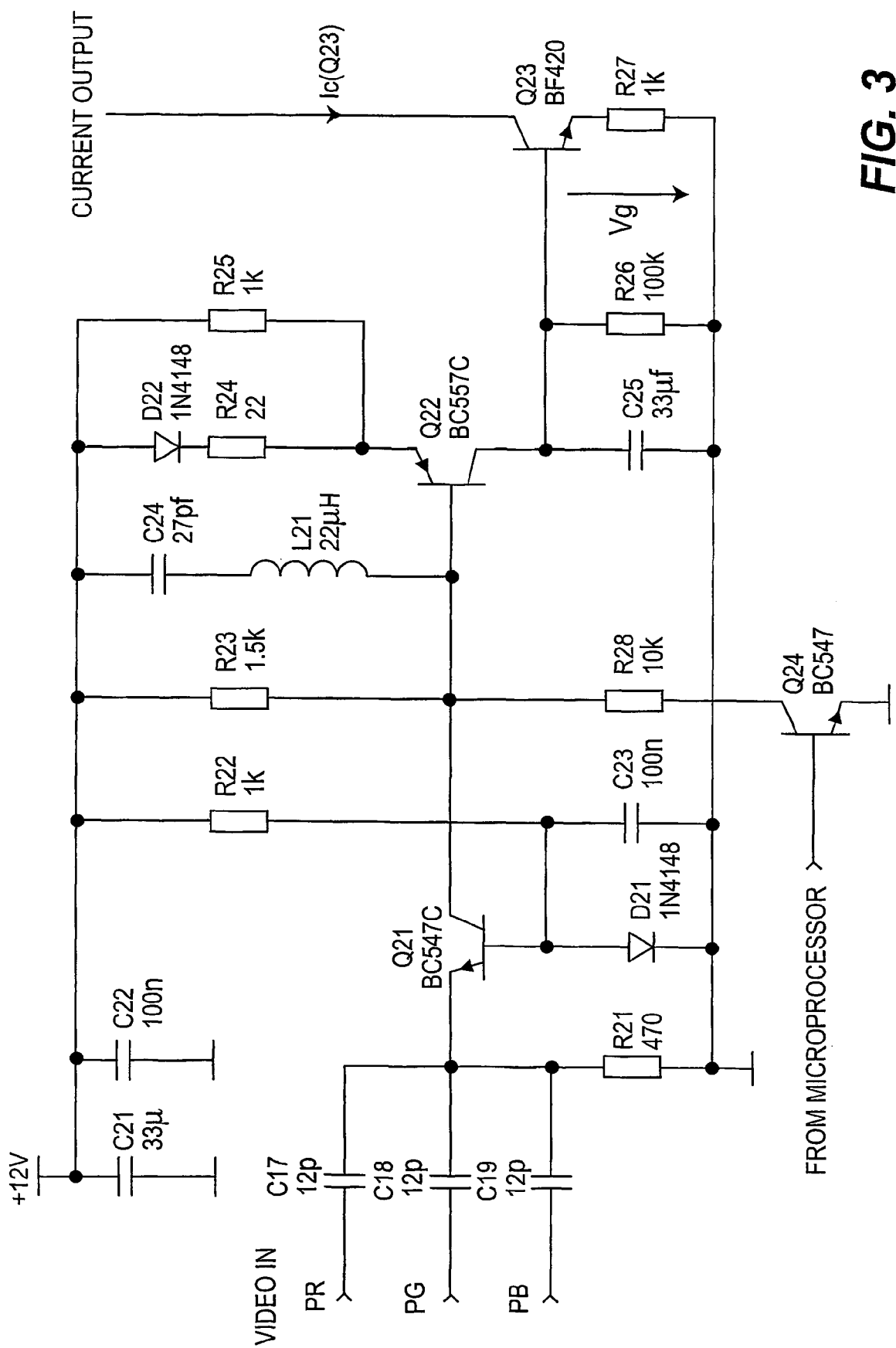
FIG. 3 is a schematic circuit showing an inventive slew rate detector for use with the inventive arrangements of FIG. 1.

The slew rate detector 300 is shown in the schematic drawing of FIG. 3 can be considered as a slew rate and a frequency detector. Since slew rate is proportional to the first derivative of a signal the detector must act as a high-pass filter. Video signals representing the individual color signals are AC coupled and differentiated by capacitors Cr, Cb, Cg, and summed in a low impedance at an emitter of a grounded base NPN transistor amplifier Q21. The base of transistor Q21 is decoupled to ground by capacitor C23 and biased by diode D21 which is supplied from a +12 volt supply via resistor R22. Negative signal components of sufficient amplitude at the emitter of transistor Q21 cause the transistor to conduct and form negative or rectified pulses, summed and amplified signal at the collector of amplifier Q21. This output signal is developed across load resistor R23 which is connected in parallel with a notch filter formed by a series connected network of inductor L21 and capacitor C24 which resonate at about 6.5 MHz. Thus the rectified and filtered signal is supplied to the base of PNP transistor amplifier Q22.

Whenever the signal at the base of transistor amplifier Q22 is less than a certain level, transistor Q22 becomes conductive causing capacitor C25 to be charged towards the +12 volt supply. When transistor Q22 is non-conductive capacitor C25 is discharged via resistor R26 and the input impedance of transistor Q23 which define a discharge time constant of about 2 seconds. The discharge time is in part required to permit any display signal DC shifts to be corrected by the slow, field rate, action of the AKB loop. Furthermore the discharge time ensures that unnecessarily frequent bandwidth switching is avoided. The voltage across capacitor C25 is applied to the base of transistor Q23, which with emitter resistor R27, form a current source that controls the bias of current source transistor Q2 and the operating point of the video output amplifier shown in FIG. 2.

As mentioned previously, microcontroller block 400 can generate a bandwidth determining control signal which is coupled to the base of switch transistor Q24 which switches resistor R28 to ground and changes the bias on transistor Q22. Thus transistor Q22 can be forced to a predetermined current and hence the video amplifier 200 bandwidth can be preset in response to a bandwidth determination from microcontroller 400. For example, with transistor Q24 turned on transistor Q22 causes the voltage across capacitor C25 to rise thereby increasing bandwidth control current Ic(Q23) which consequently causes the bandwidth amplifier 200 to be increased. Conversely, when microcontroller 400 holds transistor Q24 off, negative signal components from transistor Q21 are required to cause a rise in the voltage across capacitor 25 with the resulting increase in both current and bandwidth of amplifier 200.

The relationship between control voltage generated across capacitor C25 and the corresponding effect on the bandwidth amplifier 200 is illustrated in FIG. 4. The beneficial consequences of adaptive bandwidth control is shown in the table of FIG. 5 which demonstrates temperature differences, measured at an ambient temperature of 25 degrees C., during operation with two different bandwidths and two different input signals. The advantageous use of a variable bandwidth video driver reduces the power consumption by 50% during low-bandwidth operation, saving a total of 6W and in addition the temperature of transistors Q4, Q5 heatsinks are reduced by about 30%.

The invention claimed is:

1. In a cathode ray tube display, a video amplifier comprises: a video input signal;
    a drive amplifier; and,
    a control signal generator generating a control signal for controlling a bandwidth of said drive amplifier responsive to frequency components present in said video input signal prior to amplification by said drive amplifier, wherein said frequency components being indicative of said video input signal occupying a first bandwidth said control signal causes said drive amplifier to assume a first bandwidth, and said frequency components being indicative of said video input signal occupying a second bandwidth greater than said first bandwidth, said control signal causes said drive amplifier to assume a second bandwidth wherein said control signal generator comprises a slew rate detector comprising a signal differentiator.

2. The video amplifier of claim 1, wherein controlled operation of said drive amplifier with said first bandwidth a current (1c) in said drive amplifier has a first value.

3. The video amplifier of claim 2, wherein controlled operation of said drive amplifier with said second bandwidth said current (1c) in said drive amplifier has a second value greater than said first value.

4. The video amplifier of claim 1, wherein during controlled operation of said drive amplifier with said first bandwidth said drive amplifier dissipates a first power value.

5. The video amplifier of claim 4, wherein during controlled operation of said drive amplifier with said second bandwidth said drive amplifier dissipates a second power value greater than said first power value.

6. A video amplifier for a cathode ray tube display, comprising;
    a video processing amplifier for amplifying a video display input signal, an output drive amplifier coupled to said video processing amplifier and supplying said an amplified video display signal from said video processing amplifier for display by said cathode ray tube;
    wherein said output drive amplifier is coupled to said video processing amplifier to form a negative feed back loop (AKB), and a feed forward open loop control signal generated by differentiation of an output of said video processing amplifier and applied to control a bandwidth of said output drive amplifier.

7. The video amplifier of claim 6, wherein said negative feed back loop controls a DC component in said amplified video display signal.

8. The video amplifier of claim 6, wherein said feed forward open loop control signal controls a current in said output drive amplifier.

9. The video amplifier of claim 6, wherein said feed forward open loop control signal controls power dissipation in said output drive amplifier.

10. The video amplifier of claim 6, wherein a bandwidth of said output drive amplifier is controlled responsive to said feed forward open loop control signal.

11. The video amplifier of claim 6, wherein said feed forward open loop control signal is generated in accordance with a slew rate of said video input signal.

12. A method for controlling dissipation in a video amplifier display comprising the steps of:
    setting a first current (1c) for establishing a first gain bandwidth product in said video amplifier,
    generating at an input of said video amplifier a control signal in accordance with a slew rate of said video amplifier input signal; and,
    modifying said first current (1c) responsive to said control signal such that said video amplifier gain bandwidth product is controlled in accordance with said slew rate.

13. The method of claim 12, wherein said setting step comprises; determining a low dissipation operating point for said video amplifier.

14. The method of claim 12, wherein said setting step comprises; establishing a first bandwidth for said video amplifier.

15. The method of claim 12, wherein said generating step comprises;
    forming said control signal in proportion to a magnitude of said output amplifier input signal slew rate.

16. The method of claim 12, wherein said generating step comprises;
    increasing a bandwidth of said video amplifier in accordance with an
    increase in magnitude of said output amplifier input signal slew rate.

17. The method of claim 13, wherein said modifying step comprises;
    determining an operating point for said video amplifier with dissipation greater than said low dissipation operating point.

18. The method of claim 17, wherein said determining. step comprises;
    establishing a second bandwidth for said video amplifier greater than said first bandwidth.

* * * * *